(12) United States Patent
Enriquez Shibayama et al.

(10) Patent No.: US 10,477,684 B2
(45) Date of Patent: Nov. 12, 2019

(54) APPARATUS, SYSTEM, AND METHOD INCLUDING A BRIDGE DEVICE FOR INTERFACING A PACKAGE DEVICE WITH A SUBSTRATE

(71) Applicant: Intel Corporation, Santa Clara, CA (US)

(72) Inventors: Raul Enriquez Shibayama, Zapopan (MX); Beom-Taek Lee, Mountain View, CA (US); Carolina Garcia Robles, Tlaquepaque (MX)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 14/866,637

(22) Filed: Sep. 25, 2015

(65) Prior Publication Data
US 2017/0094791 A1     Mar. 30, 2017

(51) Int. Cl.
*H05K 1/14*        (2006.01)
*H05K 1/02*        (2006.01)
(Continued)

(52) U.S. Cl.
CPC ........... *H05K 1/141* (2013.01); *H05K 1/0296* (2013.01); *H05K 1/111* (2013.01); *H05K 1/115* (2013.01);
(Continued)

(58) Field of Classification Search
CPC ........................... H01L 21/563; H01L 25/0657
(Continued)

(56) References Cited

U.S. PATENT DOCUMENTS 5,367,435 A    11/1994   Andros et al.
5,473,510 A * 12/1995   Dozier, II ........... H01L 23/4006
                                                          174/548
(Continued)

FOREIGN PATENT DOCUMENTS

| JP | 2000164772 | 6/2000 |
|----|------------|--------|
| JP | 2003258142 | 9/2003 |
| JP | 2006261543 | 9/2006 |

OTHER PUBLICATIONS

International Search Report and Written Opinion for PCT Patent Application No. PCT/US16/42837 dated Oct. 21, 2016, 16 pgs.
(Continued)

*Primary Examiner* — Tuan T Dinh
(74) *Attorney, Agent, or Firm* — Alliance IP, LLC

(57) ABSTRACT

Techniques and mechanisms for facilitating connection between a packaged device and a substrate of another device. In an embodiment, a device—such as a printed circuit board—comprises a substrate and a hardware interface at a first side of the substrate, the hardware interface to couple the device to a package including integrated circuitry. The device is further configured to couple to a bridge device via contacts disposed at a second side of the substrate. An interconnect extends from the hardware interface to one of the contacts at the second side. In another embodiment, coupling the substrate to the bridge device interconnects two of the contacts at the second side to one another via the bridge device, where one or more contacts of the hardware interface (e.g., only a subset of all such contacts) are also interconnected with the bridge device via the second side.

20 Claims, 9 Drawing Sheets

(51) Int. Cl.
*H05K 1/11* (2006.01)
*H05K 1/18* (2006.01)
*H05K 3/32* (2006.01)
*H05K 3/36* (2006.01)
*H05K 3/22* (2006.01)
*H05K 3/34* (2006.01)

(52) U.S. Cl.
CPC .............. *H05K 1/181* (2013.01); *H05K 3/32* (2013.01); *H05K 3/368* (2013.01); *H05K 1/144* (2013.01); *H05K 3/222* (2013.01); *H05K 3/3436* (2013.01); *H05K 2201/042* (2013.01)

(58) Field of Classification Search
USPC ................ 361/760–784, 790, 792–795, 803
See application file for complete search history.

(56) References Cited

U.S. PATENT DOCUMENTS

| | | | | |
|---|---|---|---|---|
| 6,456,502 B1* | 9/2002 | Miller | .................... | H05K 1/023 174/250 |
| 6,462,421 B1* | 10/2002 | Hsu | ..................... | H01L 25/0657 257/723 |
| 7,045,887 B2* | 5/2006 | Karnezos | .............. | H01L 21/563 257/686 |
| 7,411,283 B2* | 8/2008 | Hockanson | ............. | G06F 1/182 257/678 |
| 7,558,072 B2* | 7/2009 | Chen | ...................... | H05K 1/141 361/718 |
| 8,254,144 B2* | 8/2012 | Matsumoto | .......... | H05K 1/0224 257/659 |
| 2006/0279940 A1* | 12/2006 | Chakravorty | ..... | H01L 23/49822 361/763 |
| 2014/0174807 A1 | 6/2014 | Roy et al. | | |
| 2015/0223336 A1 | 8/2015 | Lee et al. | | |

OTHER PUBLICATIONS

PCT Application No. PCT/US2016/042837, Notification Concerning Transmittal of International Preliminary Report on Patentability, dated Apr. 5, 2018, 7 pgs.

\* cited by examiner

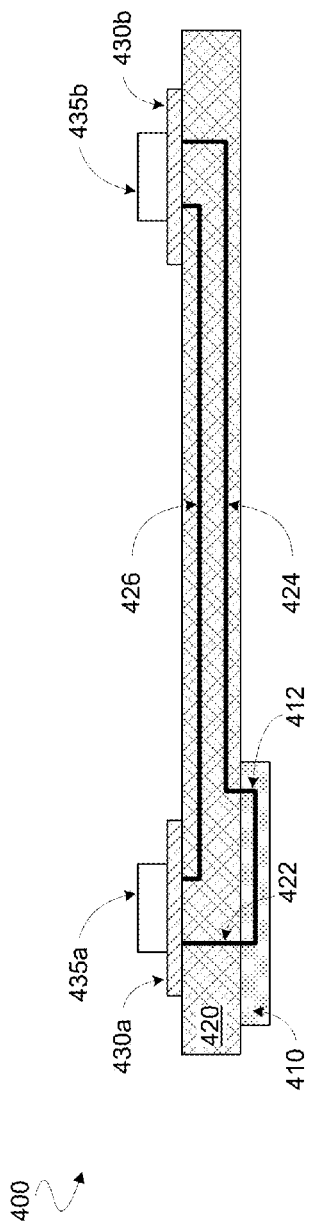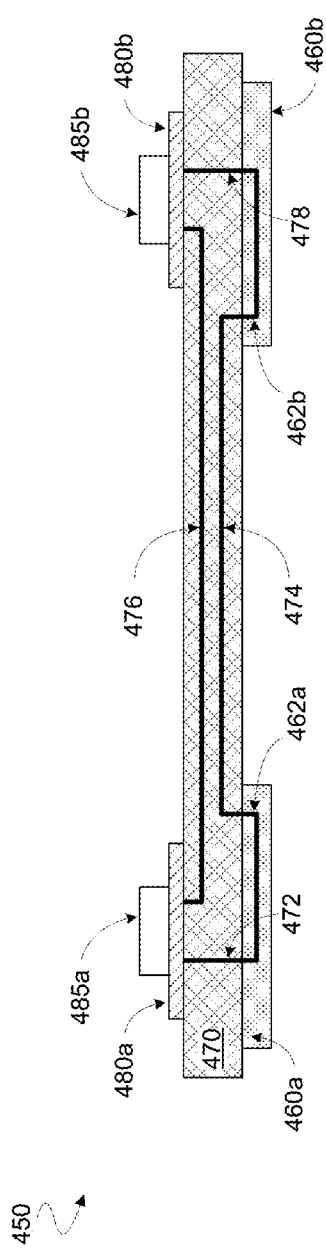

APPARATUS, SYSTEM, AND METHOD INCLUDING A BRIDGE DEVICE FOR INTERFACING A PACKAGE DEVICE WITH A SUBSTRATE

BACKGROUND

1. Technical Field

Embodiments discussed herein relate generally to the field of printed circuit boards, and more specifically, but not exclusively, to structures for interconnecting a substrate with a packaged device.

2. Background Art

Integrated circuitry of a system is often disposed in a packaged device, which is usually mounted on a substrate, such as a printed circuit board, having conductors to provide for connection with the integrated circuit package. A typical system, for example, includes one or more microprocessors, memory, graphics processors and other complex integrated circuits that are variously packaged and mounted for interconnection with a printed circuit board or other substrate. Usually, a microelectronics package has a significant number of conductive routes (for the routing of power/ground and input/output signals) between an integrated circuit thereof, such a microprocessor, a chipset, a graphics device, a wireless device, a memory device, an application specific integrated circuit, or the like, and external interconnects used to connect the microelectronics package to external components, such as motherboards, interposers, printed circuit boards, and the like. Typically, the formation of the significant number of conductive routes tends to necessitate stringent design rules and the formation of relatively large microelectronic devices.

The microelectronic industry is continually striving to produce ever faster and smaller microelectronic packages for use in various mobile electronic products, such as portable computers, electronic tablets, cellular phones, digital cameras, and the like. As successive generations of integrated circuits continue to scale in size and increase in data rates, crosstalk, interconnect density and other associated problems pose an increasing challenge to operation of a packaged device with circuitry coupled via the substrate of another device.

BRIEF DESCRIPTION OF THE DRAWINGS

The various embodiments of the present invention are illustrated by way of example, and not by way of limitation, in the figures of the accompanying drawings and in which:

FIGS. 4A, 4B are cross-sectional views of systems each interconnect respective circuit devices according to a corresponding embodiment.

DETAILED DESCRIPTION

Figure 1:
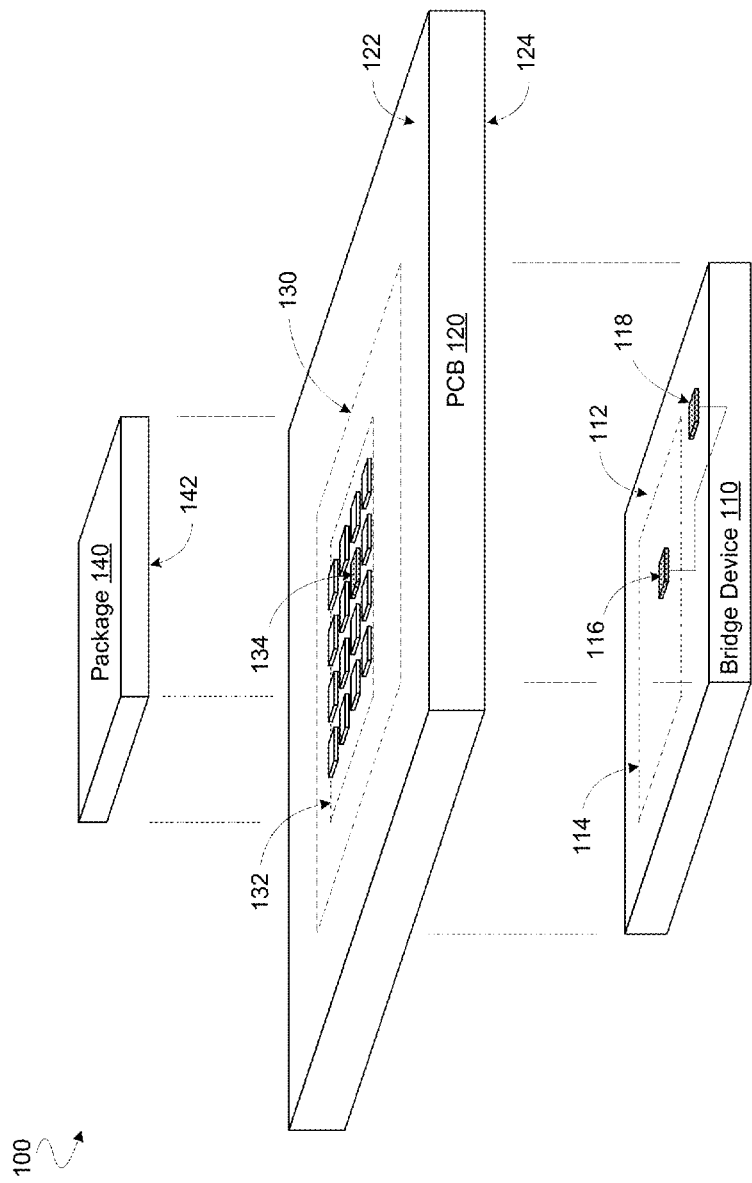
FIG. 1 is an exploded view illustrating elements of a system to interconnect circuit devices according to an embodiment.

Embodiments discussed herein variously include techniques and/or mechanisms for a bridge device to aid in operation of a packaged device with a substrate such as that of a printed circuit board (PCB). A bridge device according to one embodiment may enable reduction in a total number interconnect layers in a substrate of a PCB, or other such device, that is to couple to the bridge device. For example, one or more interconnect paths of the bridge device may eliminate the need for alternative path structures in a PCB. By providing interconnect structures at or near a breakout region of a substrate, for example, the substrate may allow for at least some breakout routing to be offloaded to the bridge device—e.g., where a path for exchanging a signal, supply voltage, reference potential and/or the like is routed from the substrate to the bridge and back to the substrate. As a result, certain embodiments, as compared to existing substrate routing techniques, allow for simpler design of interconnect structures in a breakout region—e.g., where such designs do not have as significant a tradeoff in terms of signal crosstalk.

As used herein, "interconnect" refers to any of a variety of connection paths configured to provide for a pass-through exchange between two ends of the interconnect. An interconnect may be configured so that any connection of other circuitry (external to the interconnect) to one end of the interconnect via some portion of the interconnect is a connection to that end via the other end of the interconnect. An interconnect may include only a combination of one or more metal traces, vias or other such conductors. However, in some embodiments, an interconnect may further comprise a passive circuit element, such as an alternating current (AC) coupling capacitor, coupled to the ends of the interconnect by respective conductors of the interconnect.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including integrated circuitry.

FIG. 1 shows an exploded view of a system 100 to enable operation of a packaged integrated circuit device with a substrate according to an embodiment. System 100 is just one example of an embodiment wherein a packaged device may couple to a hardware interface at a first side of a substrate, wherein a bridge device may couple to a second side of the substrate (opposite the first side). In such an embodiment, the bridge device may interconnect contacts on the substrate with one another, where one or more contacts of the hardware interface (e.g., only a subset of all such contacts) are also interconnected with the bridge device via the second side. As used herein, "contact" may refer to a conductive pad, pin, ball, bump and/or any of various other such connection hardware structures.

In the illustrative embodiment of system 100, a PCB 120 has sides 122, 124 which are opposite one another. A package 140 may be coupled to PCB 120—e.g., where a hardware interface 132 that is disposed at side 122 includes contacts to variously couple each to a respective one of other contacts (not shown) at a side 142 of package 140. PCB 120 may further couple to a bridge device 110—e.g., where contacts on a side 112 of bridge device 110 are coupled each to a respective one of other contacts (not shown) disposed at a side 124 of PCB 120. By way of illustration, contacts of bridge device 110 may include contacts 116, 118—on side 112—which are coupled to one another via an interconnect that extends in a substrate of bridge device 110. Different embodiments may be variously implemented, for example, entirely by bridge device 110, entirely by PCB 120 or by an assembly including bridge device 110 and PCB 120. Although certain embodiments are not limited in this regard, contact 116 (and/or others of the one or more contacts) may be disposed in an area 114 of side 112 that is to be coupled at a location below hardware interface 132. Alternatively or in addition, contact 118 may couple to side 124 at a point that is located outside of area 114—e.g., where contact 118 is below an area 130 of side 122. Package 140 may overlap only part of area 130, in various embodiments.

Bridge device 110 may enable improved routing for connection between package 140 and interconnect structures (not shown) that variously extend in PCB 120. For example, PCB 120 may have interconnects (not shown) variously extending each from a respective one of the plurality of contacts of hardware interface 132. Such interconnects may each include respective one or more vias and/or one or more conductive trace portions to variously provide coupling of the hardware interface 132 to circuitry included in or coupled to PCB 120. In an embodiment, interconnects of PCB 120 that are coupled to hardware interface 132 may couple a subset of the contacts of hardware interface 132 (e.g., only a subset of such contacts) to one or more contacts of bridge device 110. In some embodiments, each contact of hardware interface 132 is coupled via a respective interconnect of PCB 120 to bridge device 110. Additionally, one or more other interconnects of PCB 120 may be variously coupled each to a respective contact disposed on side 112.

In an illustrative scenario according to one embodiment, hardware interface 132 may include a contact 134 that is coupled by a via (not shown) extending in PCB 120 to another contact (not shown) disposed at side 124. In such an embodiment, the other contact at side 124 may facilitate, in combination with bridge device 110, coupling of contact 134 to contact 116 and, in turn, to contact 118. Furthermore, connection of contact 118 to still another contact (not shown) on side 124 may provide for coupling of contact 134 to an interconnect of PCB 120 via bridge device 110. Accordingly, bridge device 110 may provide interconnect paths that are located off of PCB 120, but which provide for bridging between different interconnect structures of PCB 120.

Figure 2:
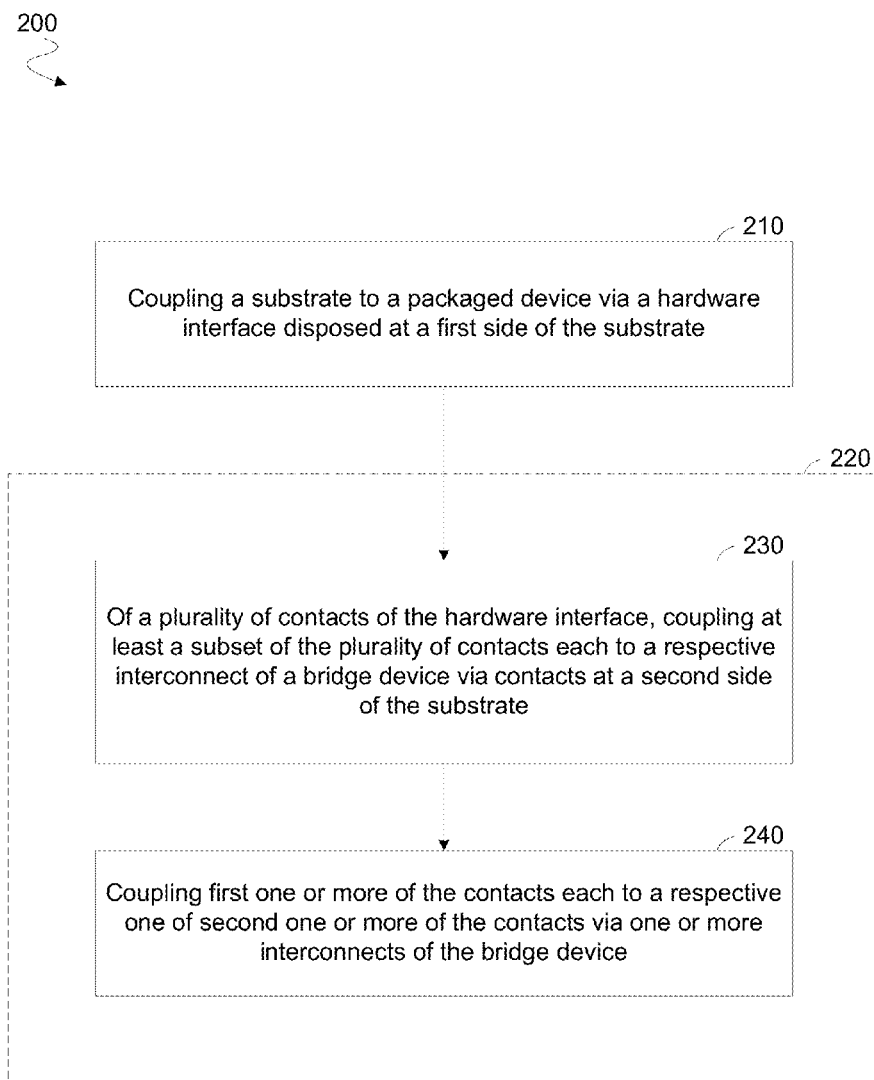
FIG. 2 is a flow diagram illustrating elements of a method to interconnect a substrate and a packaged device according to an embodiment.

FIG. 2 illustrates elements of a method 200 for providing connectivity with a bridge device according to an embodiment. Method 200 may include operations to assemble or otherwise produce system 100, for example. In an embodiment, method 200 includes, at 210, coupling a substrate to a packaged device via a hardware interface disposed at a first side of the substrate. The coupling at 210 may comprise, for example, soldering or otherwise coupling package 140 to hardware interface 132.

Method 200 may further comprise other operations 220 to provide for coupling of the packaged device to one or more interconnects of the substrate, where such coupling is via a path or paths that include interconnect structure of a bridge device (e.g., bridge device 110). For example, operations 220 may include, at 230, coupling that, of a plurality of contacts of the hardware interface, couples at least a subset (and in an embodiment, only a subset) of the plurality of contacts each to a respective interconnect of the bridge device. The one or more contacts of the subset may be coupled to the bridge device at 230 each via a respective contact at a second side of the substrate. One or more other contacts of the hardware interface may (rather than being coupled via the second side to the bridge device) instead be coupled, independent of the bridge device, to other circuitry in or on the PCB. In an embodiment, the operations 220 further comprise, at 240, coupling a first one or more contacts disposed at the second side of the substrate, via one or more interconnects of the bridge device, each to a respective one of second one or more contacts disposed at the second side. The coupling at 240 may merely provide for bridging of one or more pairs of contacts that are disposed on the second side of the substrate.

Figure 3A:
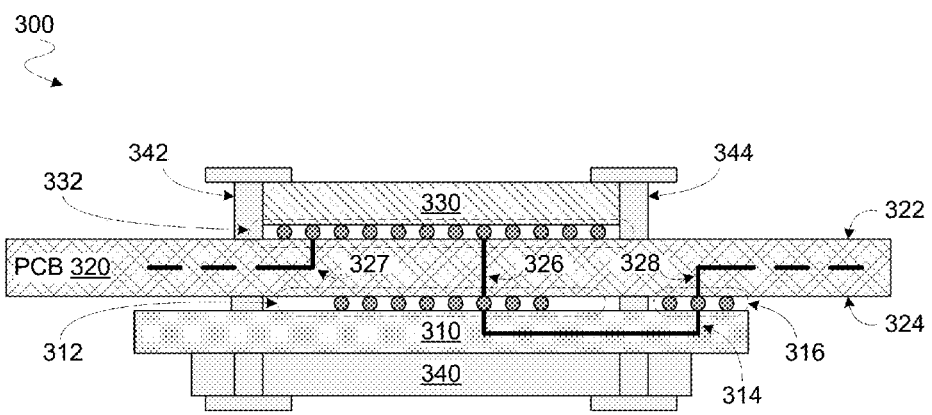
FIG. 3A is a cross-sectional view of a system to interconnect circuit devices according to an embodiment.

FIG. 3A is a cross-sectional side view of a system 300 provide connection with a bridge device according to an embodiment. System 300 may include one or more features of system 100, for example. In an embodiment, fabrication, assembly and/or other processing to provide system 300 includes operations of method 200.

In the illustrative embodiment shown, system 300 includes a package 330 that is coupled to a PCB 320—e.g., a motherboard—via a hardware interface 332 that is disposed at a side 322 (opposite another side 324) of PCB 320. A bridge device 310 may also be coupled to the PCB 320—e.g., via first one or more contacts 312 and second one or more contacts 316 variously disposed at side 324. Such contacts may include pads for soldering, socket connections and/or any of various other interface hardware. Although certain embodiments are not limited in this regard, system 300 may further comprise a mounting plate 340, alignment rods 342, 344 and/or any of a variety of combinations of other hardware to fasten, secure or otherwise mechanically support coupling of PCB 320, bridge device 340 and package 330 to one another.

Bridge device 310 may couple some or all of the first one or more contacts 312 each to a respective one of the second one or more contacts 316. Two such contacts may be coupled to one another by one or more vias and/or traces extending in a substrate of bridge device 310—e.g., where the coupling is independent of any active circuit elements (diodes, transistors, etc.) and/or any passive circuit elements (resistors, capacitors, etc.) that may be included in bridge device 310. By way of illustration and not limitation, bridge device may include an interconnect 314, opposite ends of which are variously coupled to the same side of bridge device 310. Interconnect 314 may include conductive structures (e.g., including vias and one or more traces) that, when bridge device 310 is coupled to PCB 320, couple a contact of the one or more contacts 312 to a contact of the one or more contacts 316. In some embodiments, one or more interconnects each include a respective passive component, such as a coupling capacitor. By providing such bridging across a portion of PCB 320—and back to PCB 320—bridge device 310 may enable improved routing to aid in efficient operation of package 330 with PCB 320.

For example, in the illustrative embodiment shown, interconnect 314 enables bridging of an interconnect 326 of PCB 320—via contacts 312, 316—to another interconnect 328 also of PCB 320. Interconnect 326 may include, for example, a via structure coupling one of the first one or more contacts 312 to a contact of hardware interface 332. Package 330 may have disposed therein or thereon integrated circuitry (not shown)—e.g., including a processor chip, memory chip, system-on-chip and/or the like—that is to exchange with PCB 320 respective ones of various data signals, control signals, clock signals, supply voltages, reference potentials and/or the like. At least some of such exchanges may be via different respective contacts of hardware interface 332. In some embodiments, a subset of such exchanges between package 330 and PCB 320 are at least in part via bridge device 310, where a different subset of such exchanges take place independent of any interconnect path of bridge device. For example, although package device 330 may participate in an exchange with interconnect 328 via interconnect 314, another exchange with a different interconnect 327 of PCB 320 may be independent of any interconnect of bridge device 310. Interconnect 327 may be coupled to other circuitry (not shown) in or on PCB 320, where such coupling is independent of bridge device 310.

Figure 3B:
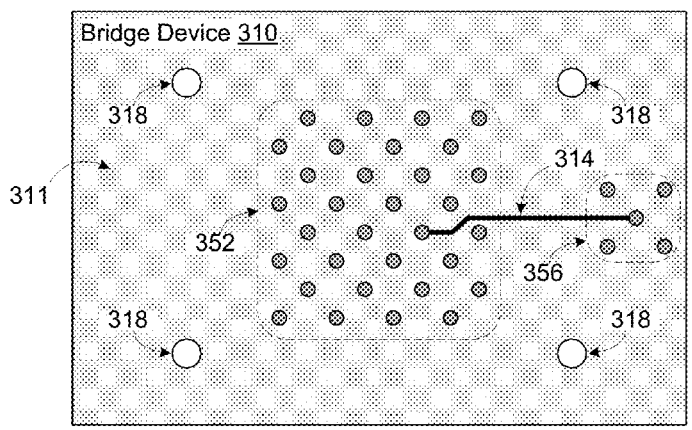
FIG. 3B is a top view of a bridge device including interconnect structures according to an embodiment.

FIG. 3B is a top side view showing an example of bridge device 310, according to one illustrative embodiment. As shown in FIG. 3B, a substrate of bridge device 310 may have a side 311 on which, or in which, is disposed one or more contacts 352 that, for example, are configured to variously couple each to a respective one of the first one or more contacts 312. Alternatively or in addition, one or more other contacts 356 disposed at side 311 may be configured to variously couple each to a respective one of the second one or more contacts 316.

In one embodiment, bridge device 300 is configured to enable alignment of one or more contacts 352 with one or more contacts 326 in a region that is, at least in part, under hardware interface 332. For example, holes 318 extending through the substrate of bridge device 310 may be configured to receive alignment rods 342, 344, where the configuration of holes 318 relative to one or more contacts 352 allows for such alignment using alignment rods 342, 344. In some embodiment, the configuration of holes 318 (and/or other structure of bridge device 310) relative to one or more contacts 356 may allow for alignment of one or more contacts 356 with one or more contacts 316 in a region that is not under hardware interface 332. For example, one or more contacts 356 may couple to one or more contacts 316 in a region that is not overlapped by package 330.

FIG. 4A is a cross-sectional side view of a system 400 provide connection with a bridge device according to an embodiment. System 400 may include features of system 100—e.g., where assembly and/or other processes to provide system 400 includes operations of method 200. System 400 includes a substrate 420 (e.g., a PCB), where a first side of the substrate 420 has disposed thereon a hardware interface 430a and another hardware interface 430b. A packaged IC device 435a of system 400 may be coupled to substrate 420 via hardware interface 430a, and another packaged IC device 435b of system 400 may be coupled via hardware interface 430a.

Packaged IC devices 435a, 435b are merely two examples of devices that may be coupled to a substrate that is further coupled to a bridge device—such as the illustrative bridge device 410—where such a device is to participate in one or more exchanges (e.g., only a subset of all exchanges) via that bridge device. In the illustrative embodiment shown, bridge device 410 is coupled to an opposite side of substrate 420, and packaged IC device 435a overlaps the side of bridge device 410 that is coupled to substrate 420. One interconnect 422 of substrate 420 extends from hardware interface 430a through to the opposite side of substrate 420. Another interconnect 424 extends from that opposite side of substrate 420 to hardware interface 430b—e.g., where hardware interfaces 430a, 430b are coupled to the same side of substrate 420. Still another interconnect 426 disposed in substrate 420 may be coupled directly to each of hardware interfaces 430a, 430b.

Due at least in part to the configuration shown, coupling of bridge device 410 to substrate 420 may result in hardware interface 430a being variously coupled to interconnects that each couple to hardware interface 430b—e.g., wherein, of a plurality of contacts of hardware interface 430a, at least a subset (e.g., only a subset) of such contacts is coupled to hardware interface 430b via bridge device 410. In an embodiment, coupling of bridge device 410 and packaged IC device 435a each to substrate 420 may result in packaged IC device 435a being variously coupled to packaged IC device 435b via different paths—e.g., only some of which include interconnect structure of bridge device 410.

FIG. 4B is a cross-sectional side view of a system 450 interconnect devices according to another embodiment. System 450 may include one or more features of system 400, for example. In the illustrative embodiment shown, system 450 comprises a substrate 470, hardware interfaces 480a, 480b and packaged IC devices 485a, 485b—e.g., corresponding functionally to substrate 420, hardware interfaces 430a, 430b and packaged IC devices 435a, 435b, respectively. In addition to packaged IC devices 485a, 485b, substrate 470 may be coupled to bridge devices 460a, 460b. Although substrate 470 is shown as being coupled to each of packaged IC devices 485a, 485b at one side, and to each of bridge devices 460a, 460b at an opposite side, certain embodiments are not limited with respect to whether or how bridge devices (or circuitry coupled via some or all such bridge devices) might be variously coupled via a particular side, or via opposite sides, of a substrate.

In an embodiment, interconnects 472, 478 of substrate 470 extend from hardware interfaces 480a, 480b, respectively, each to the opposite side of substrate 470. Another interconnect 474 extends between two contacts (not shown) on that opposite side of substrate 470, where one such contact is configured to couple to bridge device 460a, to the other contact is configured to couple to bridge device 460b. Still another interconnect 476 is coupled directly to each of hardware interfaces 480a, 480b. Bridge device 460a may include an interconnect 462a to provide for coupling of interconnects 472, 474 to one another. Similarly, bridge device 460b may include an interconnect 462b to provide for coupling of interconnects 474, 478 to one another. Due in part to the respective interconnect structures of bridge devices 460a, 460b, coupling of substrate 470 to bridge devices 460a, 460b may result in hardware interface 480a being variously coupled to interconnects that each couple to hardware interface 480b—e.g., wherein, of a plurality of contacts of hardware interface 480a, a subset of such contacts (and, in an embodiment, only that subset) is coupled to hardware interface 480b via one or both of bridge devices 460a, 460b.

Figure 5A:
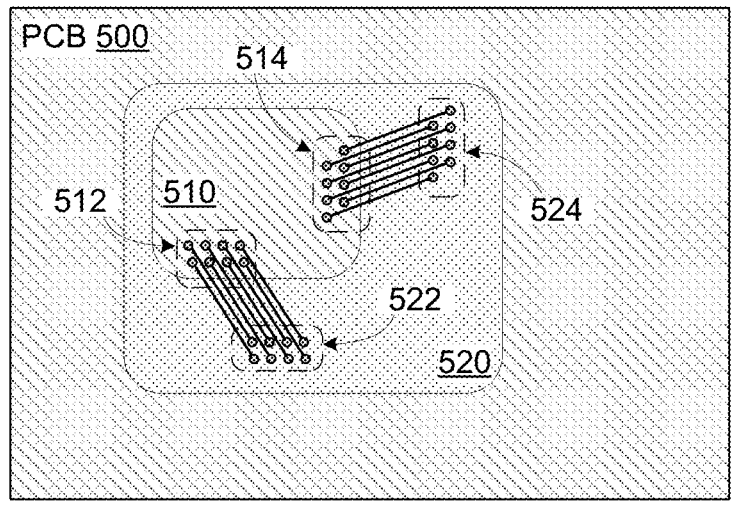
FIGS. 5A, 5B are top views of printed circuit boards each to couple to a respective packaged device according to a corresponding embodiment.

FIG. 5A is a view showing an example of printed circuit board 500, according to one illustrative embodiment. PCB 500 is one example of a device including a substrate and interface hardware to couple the substrate to a packaged IC device and to a bridge device, where interconnects variously extending in the substrate allow for connection of the packaged device with other circuitry via the bridge device. PCB 500 may include some or all of the features of PCB 120, for example.

FIG. 5A shows a first side of PCB 500 (e.g., side 124, side 324) at which are disposed contacts to couple PCB 500 to a bridge device (not shown). During such coupling, the bridge device may cover an area 520 of the first side of PCB 500. At an opposite side (not shown), PCB 500 may include a hardware interface—e.g., including an array of pads, a ball grid array or other such connection hardware—to couple PCB 500 to a packaged IC device (not shown). The hardware interface may cover an area of the opposite side that overlaps a corresponding area 510 of the first side.

One or more contacts in area 510, such as the illustrative contacts 512 and contacts 514, may be variously coupled—e.g., by respective vias extending through PCB 500—each to a corresponding contact of the hardware interface. One or more other contacts of the hardware interface may not be coupled to any contact in area 520. Coupling the bridge device to PCB 500 may provide for connection of the one or more contacts in area 510 (and the corresponding hardware interface contacts) each to another respective contact that is also disposed at the first side of PCB 500. For example, the first side may further have disposed therein or thereon one or more contacts 522 and one or more contacts 524. Some or all of contacts 522, 524 may be located within area 520 but, for example, outside of area 510. In an embodiment, interconnect structures of the bridge device variously enable coupling of contacts 512 each to a respective one of contacts 522, and/or coupling of contacts 514 each to a respective one of contacts 524. Lines shown in FIG. 5A variously indicate connectivity (provided by such a bridge device) between contacts 512 and respective ones of contacts 522, and connectivity similarly provided between contacts 514 and respective ones of contacts 524.

Figure 5B:
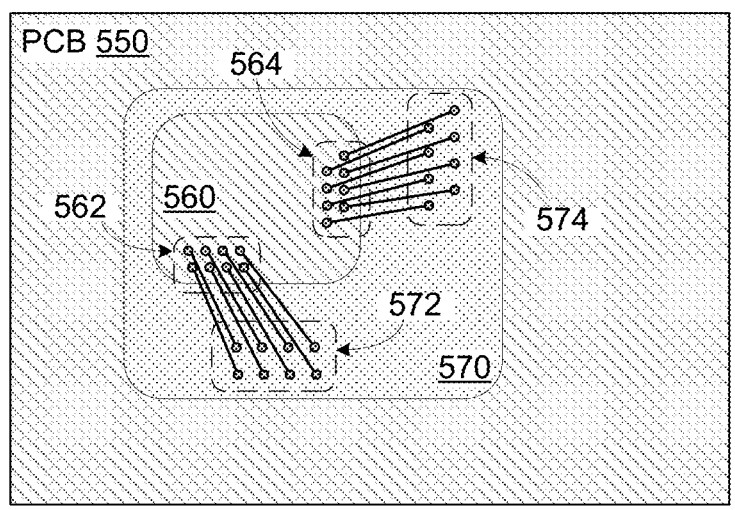

FIG. 5B shows a first side (e.g., side 124, side 324) of a PCB 550 according to another embodiment. PCB 550 may include some or all of the features of PCB 120, for example. Disposed at the first side of PCB 550 are contacts to couple PCB 550 to a bridge device—e.g., where, during such coupling, the bridge device covers an area 570 of the first side. An opposite side of PCB 550 (not shown) may include a hardware interface to further couple PCB 550 to a packaged IC device. Such a hardware interface may cover an area of the opposite side that overlaps a corresponding area 560 of the first side.

One or more contacts in area 560—such as the illustrative contacts 562 and contacts 564—may be variously coupled, via interconnects (not shown) in PCB 550, each to a corresponding contact of the hardware interface. One or more other contacts of the hardware interface may not be coupled to any contact in area 570. Coupling the bridge device to PCB 550 may include coupling one or more contacts in area 560 each to a respective contact that is also disposed at the first side of PCB 550. For example, interconnect structures of the bridge device may variously enable coupling of contacts 562 each to a respective one of contacts 572, and/or coupling of contacts 564 each to a respective one of contacts 574. Lines shown in FIG. 5B variously indicate connectivity (provided by such a bridge device) between contacts 562 and respective ones of contacts 572, and connectivity similarly provided between contacts 564 and respective ones of contacts 574.

PCB 500 and PCB 550 may, in different embodiments, variously provide for improved breakout by interconnects that are to facilitate exchanges with a packaged IC device. Such improved breakout of may be provided, for example, by PCB 500 enabling coupling of contacts 512 to contacts 522 (via a bridge device) along a first line, and coupling of contacts 514 to contacts 524 (via the bridge device) along a second line that is oblique or perpendicular to the first line. Alternatively or in addition, improved breakout may be provided by enabling coupling that changes a relative pitch between contacts and/or interconnects. For example, a relative configuration of contacts 522 to one another may be identical to a relative configuration of contacts 512 to one another. Alternatively or in addition, a relative configuration of contacts 524 to one another may be identical to a relative configuration of contacts 514 to one another. By contrast, a pitch of contacts 572 may be greater than a pitch of contacts 562 and/or a pitch of contacts 574 may be greater than a pitch of contacts 564.

Certain embodiments are not limited with respect to whether interconnects of a bridge device (or, for example, contacts on one of sides 124, 324) might have a particular configuration relative to one another. For example, interconnects of a bridge device according to an embodiment may follow respective paths that have different lengths and/or extend in different directions—e.g., where some or all of such interconnects variously form different rectilinear bends and/or non-rectilinear bends. Different portions of such interconnects may be variously parallel, perpendicular or oblique to one another, according to various embodiments. In an embodiment, a bridge device includes a plurality of interconnects having respective first ends and respective second ends, wherein a configuration of the first ends is different than a configuration of the second ends relative to each other.

Figure 6:
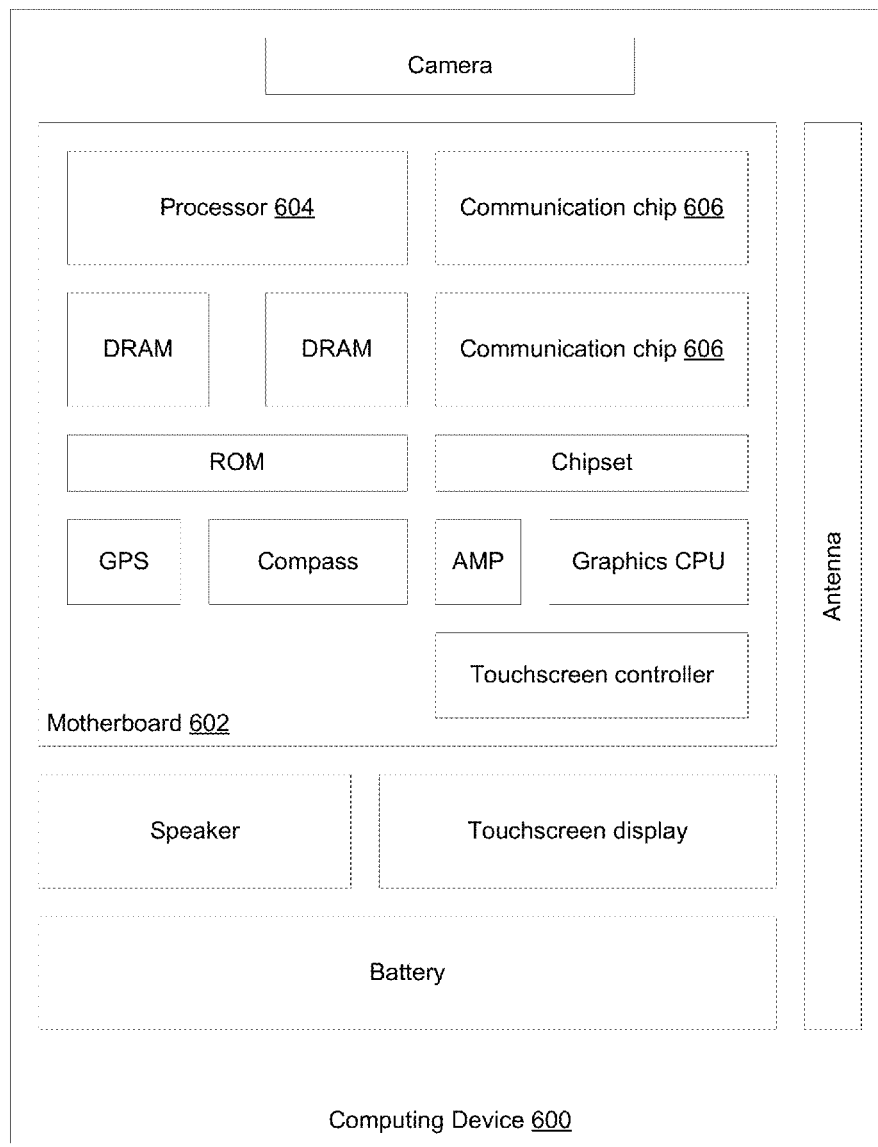
FIG. 6 illustrates a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be provided as a computer program product, or software, that may include a machine-readable medium having stored thereon instructions, which may be used to program a computer system (or other electronic devices) to perform a process according to various embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
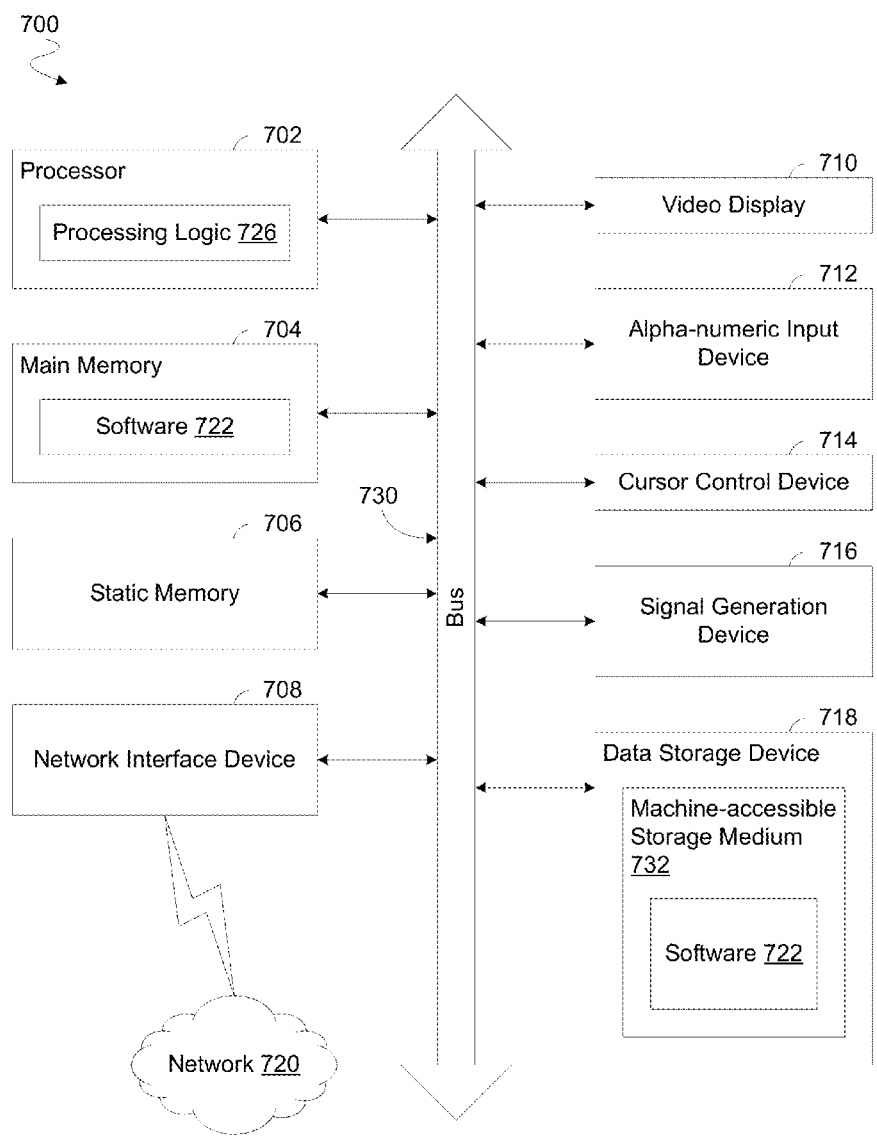
FIG. 7 illustrates a block diagram of an exemplary computer system, in accordance with an embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of an embodiment. The term "machine-readable storage medium" shall accordingly be taken to include, but not be limited to, solid-state memories, and optical and magnetic media.

Figure 8:
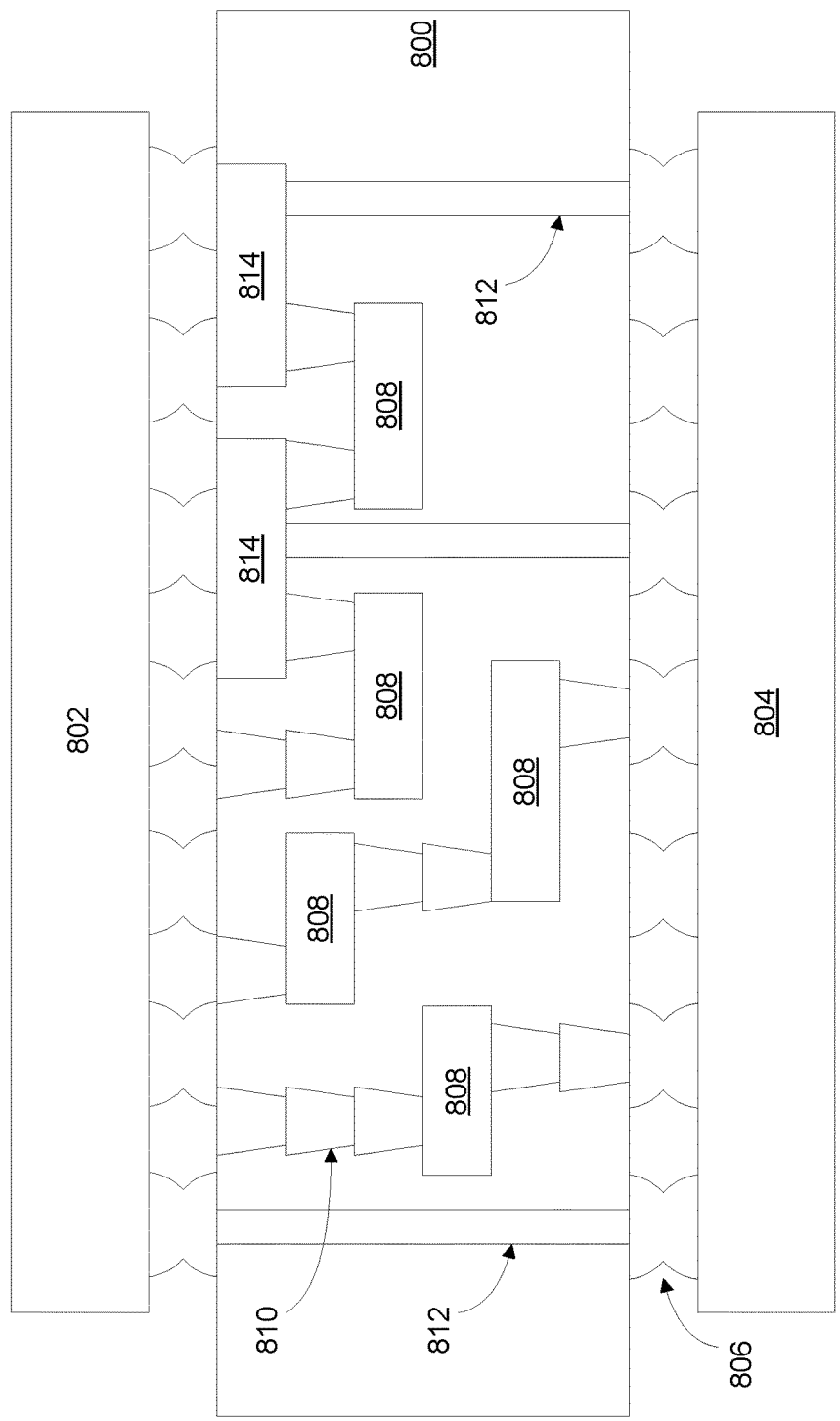
FIG. 8 is an interposer implementing one or more embodiments.

FIG. 8 illustrates an interposer 800 that includes one or more embodiments. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802, 804 are attached to opposing sides of the interposer 800. In other embodiments, the first and second substrates 802, 804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with various embodiments, apparatuses or processes disclosed herein may be used in the fabrication of interposer 800.

Figure 9:
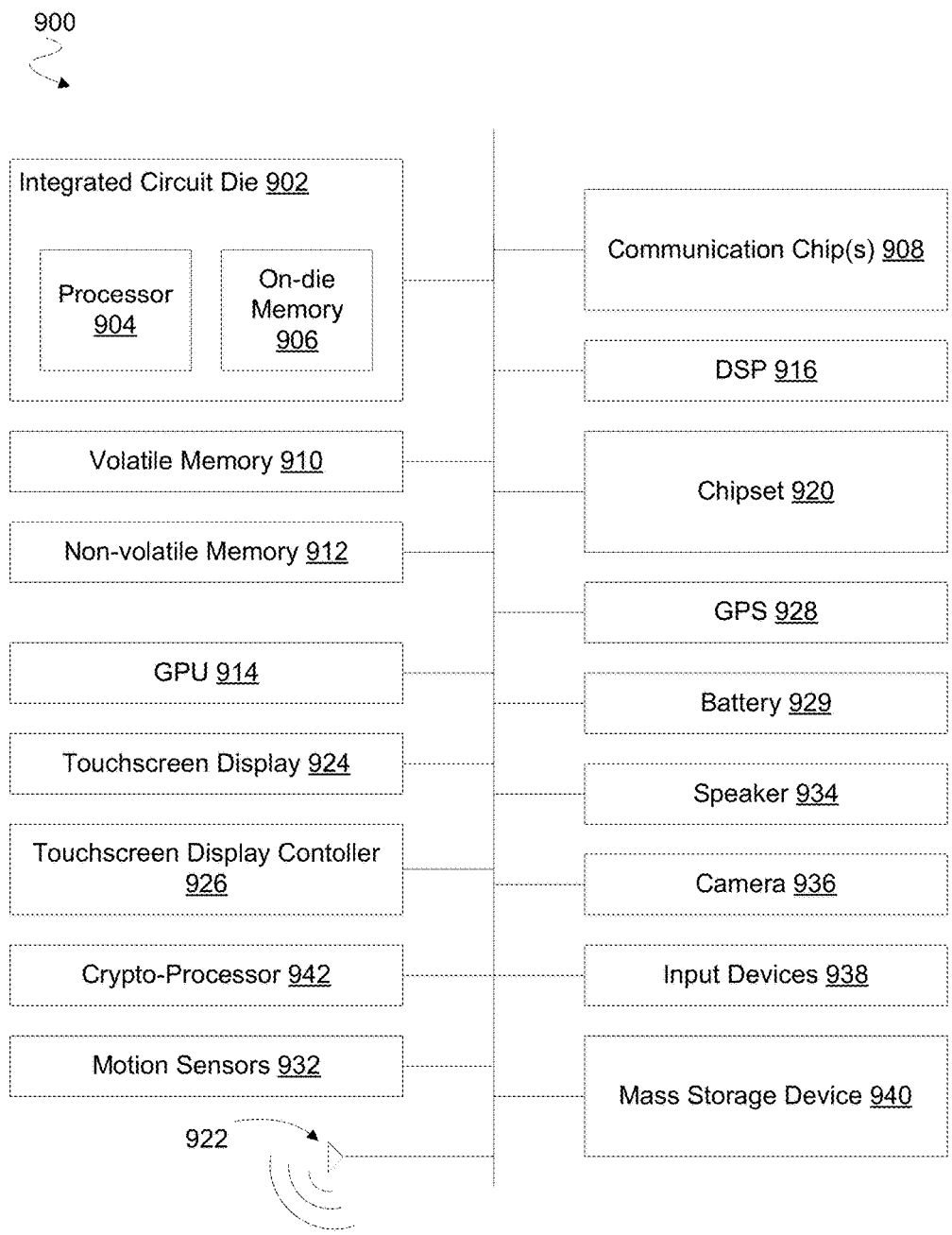
FIG. 9 is a computing device built in accordance with an embodiment.

FIG. 9 illustrates a computing device 900 in accordance with one embodiment. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 929 or other power source, a power amplifier (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

In one implementation, a device comprises a substrate, having disposed therein first one or more interconnects, a first hardware interface disposed at a first side of the substrate, and contacts disposed at a second side of the substrate, the second side opposite the first side, the contacts including first one or more contacts, wherein the first one or more interconnects each extend from a respective contact of the first one or more contacts to a respective contact of the first hardware interface, and second one or more contacts. The device is configured to couple to a first packaged device via the first hardware interface and to a first bridge device via the contacts, wherein the device is configured to couple the first one or more contacts each to a respective one of the second one or more contacts via one or more interconnects of the first bridge device, wherein, of a plurality of contacts of the first hardware interface, the device is to couple at least a subset of the plurality of contacts to any interconnect of the first bridge device via the second side.

In an embodiment, the device further comprises a second hardware interface and other contacts, wherein the second hardware interface and the other contacts are disposed at opposite respective sides of the substrate, wherein second interconnects further extend through the substrate, the second interconnects including an interconnect coupling a first one of the other contacts to the second hardware interface, and an interconnect coupling a second one of the other contacts to the first hardware interface or to one of the second one or more contacts. In another embodiment, the contacts disposed at the second side comprise a first pair of contacts configured to be couple to one another via the bridge device, the first pair of contacts disposed along a first line, and a second pair of contacts configured to be couple to one another via the bridge device, the second pair of contacts disposed along a second line that is oblique or perpendicular to the first line. In another embodiment, the contacts include first contacts and second contacts configured to be coupled via the bridge device each to a different respective one of the first contacts, wherein a pitch of the second contacts is larger than a pitch of the first contacts. In another embodiment, the first one or more contacts are located in an area of the second side that is overlapped by the first hardware interface. In another embodiment, the first one or more interconnects includes a via directly coupled both to a contact of the hardware interface and to one of the first one or more contacts. In another embodiment, the second one or more contacts are located in another area of the second side other than any area that is overlapped by the first hardware interface. In another embodiment, the device is a printed circuit board.

In another implementation, a bridge device comprises a first substrate having disposed therein first one or more interconnects, and contacts configured to couple the bridge device to a first side of a second substrate, the contacts including first one or more contacts and second one or more contacts each disposed on a side of the first substrate, wherein the first one or more interconnects each couple a respective one of the first one or more contacts to a respective one of the second one or more contacts. The first one or more contacts are configured to couple the bridge device, via one or more interconnects extending through the second substrate, to a hardware interface at the second side of the second substrate, the second side opposite the first side, wherein, of a plurality of contacts of the hardware interface, the bridge device is configured to couple to at least a subset of the plurality of contacts via the side of the substrate.

In an embodiment, the first substrate forms holes each to receive a respective hardware to align the bridge device with the second substrate. In another embodiment, the contacts comprise a first pair of contacts coupled to one another, the first pair of contacts disposed along a first line, and a second pair of contacts coupled to one another, the second pair of contacts disposed along a second line that is oblique or perpendicular to the first line. In another embodiment, the contacts include first contacts and second contacts each coupled to a different respective one of the first contacts, wherein a pitch of the second contacts is larger than a pitch of the first contacts. In another embodiment, the first one or more contacts are to couple to the second substrate at a location that is overlapped by the hardware interface. In another embodiment, the second one or more contacts are to couple to the second substrate at a location other than any that is overlapped by the first hardware interface.

In another implementation, a method comprises coupling a substrate to a first packaged device via a first hardware interface disposed at a first side of the substrate, and coupling the substrate to a first bridge device via contacts disposed at a second side of the substrate, the second side opposite the first side, including coupling first one or more of the contacts each to a respective one of second one or more of the contacts via one or more interconnects of the first bridge device. Of a plurality of contacts of the first hardware interface, coupling the substrate to the first packaged device and to the bride device couples at least a subset of the plurality of contacts to any interconnect of the first bridge device via the second side.

In an embodiment, the method further comprises coupling the substrate to a second packaged device via a second hardware interface, wherein the second hardware interface and the other contacts are disposed at opposite respective sides of the substrate, and coupling the substrate to a second bridge device via the other contacts, wherein second interconnects further extend through the substrate, the second interconnects including an interconnect coupling a first one of the other contacts to the second hardware interface, and an interconnect coupling a second one of the other contacts to the first hardware interface or to one of the second one or more contacts. In another embodiment, the contacts disposed at the second side comprise a first pair of contacts disposed along a first line, and a second pair of contacts disposed along a second line that is oblique or perpendicular to the first line, and wherein coupling the substrate to a first bridge device comprises coupling the first pair of contacts to one another via the bridge device, and coupling the second pair of contacts to one another via the bridge device.

In another embodiment, the contacts disposed at the second side include first contacts and second contacts, wherein coupling the substrate to a first bridge device includes coupling the first contacts each to a different respective one of the second contacts, wherein a pitch of the second contacts is larger than a pitch of the first contacts. In another embodiment, the first one or more contacts are located in an area of the second side that is overlapped by the first hardware interface. In another embodiment, the first one or more interconnects includes a via directly coupled both to a contact of the hardware interface and to one of the first one or more contacts. In another embodiment, the second one or more contacts are located in another area of the second side other than any area that is overlapped by the first hardware interface.

In another implementation, a system comprises a first packaged device and a printed circuit board including a substrate having disposed therein a first interconnect, a first hardware interface disposed at a first side of the substrate, wherein the first packaged device is coupled to the printed circuit board via the first hardware interface. The printed circuit board further comprises contacts disposed at a second side of the substrate, the second side opposite the first side, the contacts including a first contact, wherein the first interconnect couples the first contact to a contact of the first hardware interface, and a second contact. The system further comprises a first bridge device coupled to the printed circuit board via the contacts, wherein an interconnect of the first bridge device is coupled to the first contact and the second contact, and wherein, of a plurality of contacts of the first hardware interface, the printed circuit board couples at least a subset of the plurality of contacts to any interconnect of the first bridge device via the second side.

In an embodiment, the printed circuit board further comprises a second hardware interface and other contacts, wherein the second hardware interface and the other contacts are disposed at opposite respective sides of the substrate, wherein second interconnects further extend through the substrate, the second interconnects including an interconnect coupling a first one of the other contacts to the second hardware interface, and an interconnect coupling a second one of the other contacts to the first hardware interface or to one of the second contact. In another embodiment, the contacts disposed at the second side comprise a first pair of contacts coupled to one another via the bridge device, the first pair of contacts disposed along a first line, and a second pair of contacts coupled to one another via the bridge device, the second pair of contacts disposed along a second line that is oblique or perpendicular to the first line. In another embodiment, the contacts include first contacts and second contacts coupled via the bridge device each to a different respective one of the first contacts, wherein a pitch of the second contacts is larger than a pitch of the first contacts. In another embodiment, the first contact is located in an area of the second side that is overlapped by the first hardware interface. In another embodiment, the first interconnect includes a via directly coupled both to a contact of the hardware interface and to the first contact. In another embodiment, the second contact is located in another area of the second side other than any area that is overlapped by the first hardware interface.

Techniques and architectures for interconnecting circuit devices are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a substrate having a first side and a second side, the second side being opposite to, and spaced apart from, the first side;
   a hardware interface on the first side of the substrate, the hardware interface including a set of one or more first contacts;
   a set of one or more second contacts positioned on the second side of the substrate, wherein at least one second contact in the set of second contacts is coupled by a conductive path in the substrate to a corresponding first contact in the set of first contacts; and
   a bridge device positioned on the second side of the substrate, the bridge device including one or more pairs of bridge contacts that are coupled to each other by a conductive path in the bridge device wherein, for each pair of bridge contacts:
      one bridge contact is coupled to the at least one second contact that is electrically coupled to a corresponding first contact, and
      the other bridge contact is coupled to a third contact positioned on the second side of the substrate, wherein the bridge device creates a conductive path between the third contact and the corresponding first contact.

2. The apparatus of claim 1 wherein the bridge device includes a printed circuit board and wherein each pair of bridge contacts are electrically coupled to each other by a trace or a via in the printed circuit board.

3. The apparatus of claim 1 wherein the conductive path in the substrate is a trace or a via in the substrate.

4. The apparatus of claim 1 wherein the third contact is one of the set of second contacts.

5. The apparatus of claim 1 wherein the third contact is not one of the set of second contacts.

6. The apparatus of claim 1 wherein the substrate includes a printed circuit board.

7. The apparatus of claim 1 wherein the third contact is coupled by a conductive path in the substrate to a contact on the first side of the substrate that is not part of the set of first contacts.

8. A system comprising:
- a printed circuit board (PCB) having a first side and a second side, the second side being opposite to, and spaced apart from, the first side;
- a hardware interface on the first side of the PCB, the hardware interface including a set of one or more first contacts;
- a set of one or more second contacts positioned on the second side of the PCB, wherein at least one second contact in the set of second contacts is coupled by a conductive path in the PCB to a corresponding first contact in the set of first contacts; and
- a packaged device coupled to the hardware interface so that the packaged device is coupled to at least the corresponding first contact;
- a bridge device positioned on the second side of the PCB, the bridge device including one or more pairs of bridge contacts that are coupled to each other by a conductive path in the bridge device wherein, for each pair of bridge contacts:
  - one bridge contact is coupled to the at least one second contact that is electrically coupled to a corresponding first contact, and
  - the other bridge contact is coupled to a third contact positioned on the second side of the PCB, wherein the bridge device creates a conductive path between the third contact and the packaged device.

9. The system of claim 8 wherein the bridge device includes a printed circuit board and wherein each pair of bridge contacts are electrically coupled to each other by a trace or a via in the printed circuit board.

10. The system of claim 8 wherein the conductive path in the PCB is a trace or a via in the PCB.

11. The system of claim 8 wherein the third contact is one of the set of second contacts.

12. The system of claim 8 wherein the third contact is not one of the set of second contacts.

13. The system of claim 8 wherein the third contact is coupled by a conductive path to a contact on the first side of the PCB that is not part of the set of first contact.

14. A method comprising:
- coupling a packaged device to a hardware interface on the first side of a substrate, the substrate having a first side and a second side, the second side being opposite to, and spaced apart from, the first side, and the hardware interface including a set of one or more first contacts;
- coupling a bridge device to a set of one or more second contacts positioned on the second side of the substrate, wherein at least one second contact in the set of second contacts is coupled by a conductive path in the substrate to a corresponding first contact in the set of first contacts; and
- coupling the bridge device to one or more third contacts positioned on the second side of the substrate, wherein the bridge device includes one or more pairs of bridge contacts that are coupled to each other by a conductive path in the bridge device and wherein, for each pair of bridge contacts:
  - one bridge contact is coupled to the at least one second contact that is electrically coupled to a corresponding first contact, and
  - the other bridge contact is coupled to one of the one or more third contacts, wherein the bridge device creates a conductive path between each third contact and the packaged device.

15. The method of claim 14 wherein the bridge device includes a printed circuit board and wherein each pair of bridge contacts are electrically coupled to each other by a trace or a via in the printed circuit board.

16. The method of claim 14 wherein the conductive path in the substrate is a trace or a via in the substrate.

17. The method of claim 14 wherein the one or more third contacts are part of the set of second contacts.

18. The method of claim 14 wherein the one or more third contacts are not part of the set of second contacts.

19. The method of claim 14 wherein the substrate includes a printed circuit board.

20. The method of claim 14 wherein the third contact is coupled by a conductive path in the substrate to a contact on the first side of the substrate that is not part of the set of first contacts.

* * * * *